United States Patent
Chen et al.

(10) Patent No.: US 9,055,675 B2
(45) Date of Patent: Jun. 9, 2015

(54) FLAP DOOR MECHANISM AND ELECTRONIC DEVICE THEREWITH

(71) Applicant: Wistron Corporation, New Taipei (TW)

(72) Inventors: Guan-Wen Chen, New Taipei (TW); Chih-Chieh Hsu, New Taipei (TW); Chuan-Yi Liang, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 0 days.

(21) Appl. No.: 14/092,880

(22) Filed: Nov. 27, 2013

(65) Prior Publication Data
US 2015/0069897 A1 Mar. 12, 2015

(30) Foreign Application Priority Data
Sep. 9, 2013 (TW) .............................. 102132459 A

(51) Int. Cl.
*A47B 81/00* (2006.01)
*A47B 97/00* (2006.01)
*H05K 5/02* (2006.01)
*G06F 1/20* (2006.01)
*H05K 7/20* (2006.01)

(52) U.S. Cl.
CPC ................ *H05K 5/0239* (2013.01); *G06F 1/20* (2013.01); *H05K 7/20145* (2013.01); *H05K 7/20727* (2013.01)

(58) Field of Classification Search
CPC ......... H05K 5/02; H05K 5/0239; G06F 1/181
USPC ............... 312/223.2, 319.2, 326–328; 49/339
See application file for complete search history.

(56) References Cited

U.S. PATENT DOCUMENTS

| 5,175,386 | A * | 12/1992 | Kuwahara | 84/179 |
|---|---|---|---|---|
| 5,653,058 | A * | 8/1997 | Zaimins | 49/208 |
| 5,875,521 | A * | 3/1999 | Woo | 16/280 |
| 7,679,898 | B2 * | 3/2010 | Peng et al. | 361/679.37 |
| 8,203,836 | B2 * | 6/2012 | Chen et al. | 361/679.38 |
| 8,254,108 | B2 * | 8/2012 | Chang et al. | 361/679.36 |

(Continued)

FOREIGN PATENT DOCUMENTS

| TW | 200842667 | 11/2008 |
|---|---|---|
| TW | M429899 | 5/2012 |

OTHER PUBLICATIONS

Office action mailed on Feb. 24, 2015 for the Taiwan application No. 102132459, filing date: Sep. 9, 2013, p. 1 line 1-14, p. 2-8 and p. 9 line 1-8 Translation.

*Primary Examiner* — Daniel J Troy
*Assistant Examiner* — Andrew Roersma
(74) *Attorney, Agent, or Firm* — Winston Hsu; Scott Margo

(57) ABSTRACT

A flap door mechanism with closable function includes a door member, a resilient member and a spring arm member. The door member is pivoted to a casing. The resilient member is installed on the door member and for driving the door member to rotate in a first direction. The resilient member includes a first end and a second end. The spring arm member is selectively disposed on the door member or on the casing. The spring arm member abuts against the first end. When the door member rotates in a second direction opposite to the first direction, the spring arm member is pushed to bend by the first end or is pressed to flatten by the casing, so as to reduce deformation between the first end and the second end of the resilient member.

12 Claims, 13 Drawing Sheets

(56) References Cited

U.S. PATENT DOCUMENTS

| | | | |
|---|---|---|---|
| 2006/0236610 A1* | 10/2006 | Barnum | 49/339 |
| 2008/0266259 A1 | 10/2008 | Chiang | |
| 2010/0066219 A1* | 3/2010 | Lee | 312/237 |
| 2011/0053485 A1* | 3/2011 | Huang et al. | 454/184 |
| 2012/0132598 A1* | 5/2012 | Wang et al. | 211/26 |
| 2012/0155033 A1* | 6/2012 | Li et al. | 361/726 |
| 2014/0109484 A1* | 4/2014 | Szyjkowski | 49/465 |

\* cited by examiner

FLAP DOOR MECHANISM AND ELECTRONIC DEVICE THEREWITH

BACKGROUND OF THE INVENTION

1. Field of the Invention

The present invention relates to a flap door mechanism and an electronic device therewith, and more particularly, to a flap door mechanism with closable function and an electronic device therewith.

2. Description of the Prior Art

Generally speaking, an installing opening is disposed on a rear side of a casing of a server computer for installing the thermal fan, and the thermal fan is used for dissipating heat generated by internal components of the server computer as functioning. With enhancement of performance of the server computer, an amount of the thermal fan installed inside the installing opening increases, i.e. the server computer is equipped with a plurality of thermal fans for efficiently dissipating the heat generated by the internal components of the server computer as functioning.

However, when one of the plurality of thermal fans is detached from the casing for replacement, the installing opening without an object, i.e. the thermal fan, disposed therein forms a flow channel, and the air flow is capable of being drawn into the casing through the flow channel, which results in a reflow. The reflow will disturb flows generated by other thermal fans for heat dissipation and thus reduces heat dissipating efficiency of the thermal fans.

SUMMARY OF THE INVENTION

Thus, the present invention provides a flap door mechanism for preventing reflows and enhancing heat dissipating efficiency and an electronic device therewith for solving above drawbacks.

According to the claimed invention, a flap door mechanism with closable function includes a door member, a resilient member and a spring arm member. The door member is pivoted to a casing. The resilient member is installed on the door member and for driving the door member to rotate in a first direction. The resilient member includes a first end and a second end. The spring arm member is selectively disposed on the door member or on the casing. The spring arm member includes an abutting end for abutting against the first end. The resilient member drives the first end to push the abutting end for bending the spring arm member when the door member rotates in a second direction opposite to the first direction, so as to reduce deformation between the first end and the second end of the resilient member.

According to the claimed invention, the door member includes a through portion, and the spring arm member is connected to the door member. The second end of the resilient member abuts against the casing, and the resilient member drives the first end to push the abutting portion when the door member rotates in the second direction, such that the spring arm member is bent in a direction away from the second end and the first end and the abutting end pass through the door member via the through portion.

According to the claimed invention, the spring arm member further includes a fixing end opposite to the abutting end, and the fixing end is for being fixed on the door member.

According to the claimed invention, the fixing end is fixed on the door member in a hot melting manner.

According to the claimed invention, the spring arm member and the door member are integrally formed.

According to the claimed invention, a first assembly angle is included between the first end of the resilient member and the door member when the door member rotates to a closed position in the first direction, and a second assembly angle is included between the first end of the resilient member and the door member when the door member rotates to an opened position in the second direction.

According to the claimed invention, a first torsion angle is included between the first end and the second end of the resilient member when the door member is located in the closed position, and a second torsion angle is included between the first end and the second end of the resilient member when the door member is located in the opened position.

According to the claimed invention, the through portion is a breach.

According to the claimed invention, the spring arm member is connected to the casing, and the second end of the resilient member abuts against the door member. The resilient member drives the first end to push the abutting end when the door member rotates in the second direction, such that the spring arm member is bent to expand out of the casing in a direction away from the second end.

According to the claimed invention, the door member includes a pushing structure for pushing the spring arm member when the door member rotates in the second direction, such that the spring arm member is bent to expand out of the casing in the direction away from the second end.

According to the claimed invention, the spring arm member and the casing are integrally formed.

According to the claimed invention, a flap door mechanism with closable function includes a door member, a resilient member and a spring arm member. The door member is pivoted to a casing. The resilient member is installed on the door member and for driving the door member to rotate in a first direction. The resilient member includes a first end and a second end, and the second end abuts against the casing. The spring arm member is disposed on the door member, and the spring arm member includes a bending portion for abutting against the first end. The casing presses the bending portion to be flattened on the door member when the door member rotates in a second direction opposite to the first direction, so as to reduce deformation between the first end and the second end of the resilient member.

According to the claimed invention, the spring arm member further includes a fixing portion and a sliding portion. The fixing portion is connected to an end of the bending portion and for being fixed on the door member. The sliding portion is connected to another end of the bending portion and for slidably abutting against the door member.

According to the claimed invention, an electronic device includes a casing and a flap door mechanism. The flap door mechanism is installed on the casing and includes a door member, a resilient member and a spring arm member. The door member is pivoted to the casing. The resilient member is installed on the door member and for driving the door member to rotate in a first direction, and the resilient member includes a first end and a second end. The spring arm member is selectively disposed on the door member or on the casing, and the spring arm member includes an abutting end for abutting against the first end. The resilient member drives the first end to push the abutting end for bending the spring arm member when the door member rotates in a second direction opposite to the first direction, so as to reduce deformation between the first end and the second end of the resilient member.

According to the claimed invention, an electronic device includes a casing and a flap door mechanism. The flap door mechanism is installed on the casing and includes a door member, a resilient member and a spring arm member. The door member is pivoted to the casing. The resilient member is installed on the door member and for driving the door member to rotate in a first direction. The resilient member includes a first end and a second end, and the second end abuts against the casing. The spring arm member is disposed on the door member, and the spring arm member includes a bending portion for abutting against the first end. The casing presses the bending portion to be flattened on the door member when the door member rotates in a second direction opposite to the first direction, so as to reduce deformation between the first end and the second end of the resilient member.

In summary, when the door member rotates to be closed on the casing in the first direction, the resilient member of the flap mechanism of the present invention is utilized for generating the torque resulting from deformation, so as to resist the flow from pushing the door member and prevent the flow from being drawn into the casing via the door member. In such a manner, the flap door mechanism prevents the reflow resulting from the flow from being drawn into the casing, so as to prevent the reflow from disturbing the heat dissipating flow inside the casing and thus to enhance the heat dissipating efficiency of the electronic device.

In addition, when the door member rotates to be opened relative the casing in the second direction, either the bend of the spring arm member resulting from being activated by the end of the resilient member or deformation of the spring arm member resulting from being pressed by the casing is utilized for reducing the deformation between the two ends of the resilient member, so as to prevent the two ends of the resilient member from deforming permanently due to over deformation. In other words, the flap door mechanism of the present invention utilizes the spring arm member for avoiding the resilient member from being deformed permanently, so as to confirm the movement of the flap door mechanism and elongate the life of the flap door mechanism.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the embodiments, reference is made to the accompanying drawings which form a part hereof, and in which is shown by way of illustration specific embodiments in which the invention may be practiced. In this regard, directional terminology, such as "top," "bottom," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless limited otherwise, the terms "connected," and "installed" and variations thereof herein are used broadly and encompass direct and indirect connections and installations. Accordingly, the drawings and descriptions will be regarded as illustrative in nature and not as restrictive.

Figure 1:
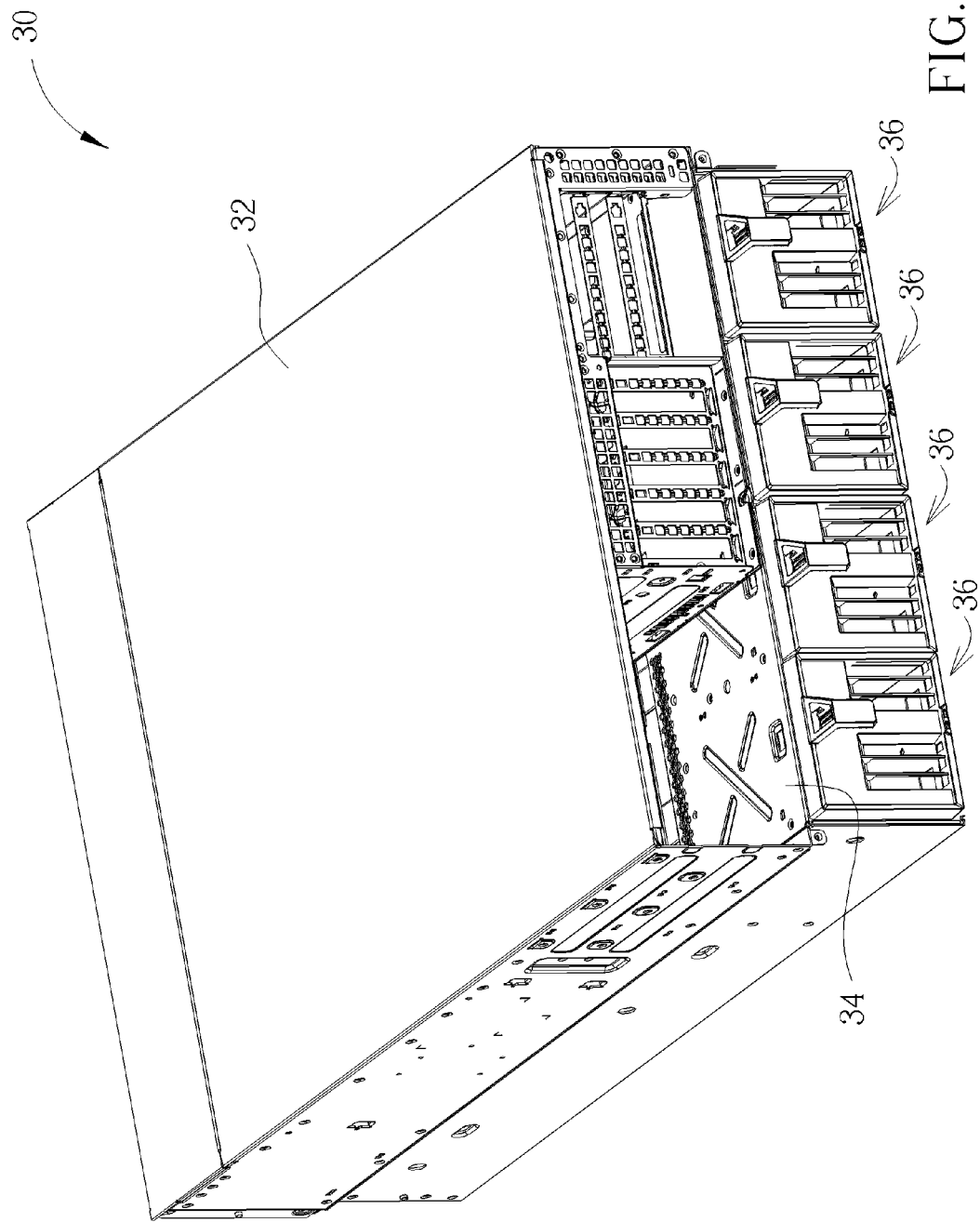
FIG. 1 is a diagram of an electronic device according to a first embodiment of the present invention.
Figure 2:
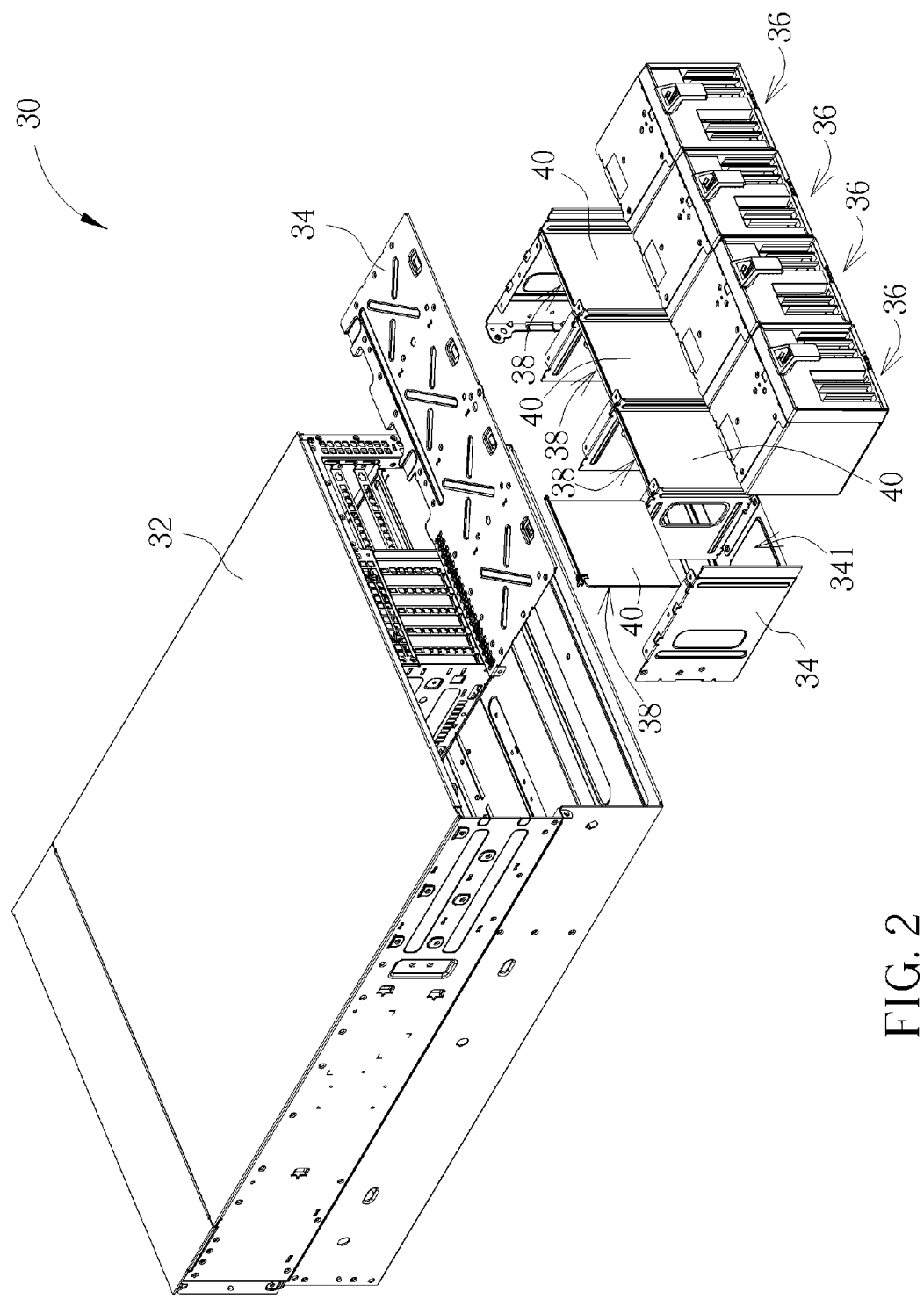
FIG. 2 is an exploded diagram of the electronic device according to the first embodiment of the present invention.

Please refer to FIG. 1 and FIG. 2. FIG. 1 is a diagram of an electronic device 30 according to a first embodiment of the present invention. FIG. 2 is an exploded diagram of the electronic device 30 according to the first embodiment of the present invention. As shown in FIG. 1 and FIG. 2, the electronic device 30 includes a housing 32, a casing 34 and a plurality of thermal fans 36. The housing 32 is used for covering internal components of the electronic device 30, so as to prevent the internal components of the electronic device 30 from damage due to collision. The casing 34 is used for installing the plurality of thermal fans 36 and fixing the plurality of thermal fans 36 on a side (i.e. a rear side) of the housing 32. The plurality of thermal fans 36 are respectively used for generating heat dissipating flows, so as to dissipate heat generated by the internal components of the electronic device 30 as functioning.

Figure 3:
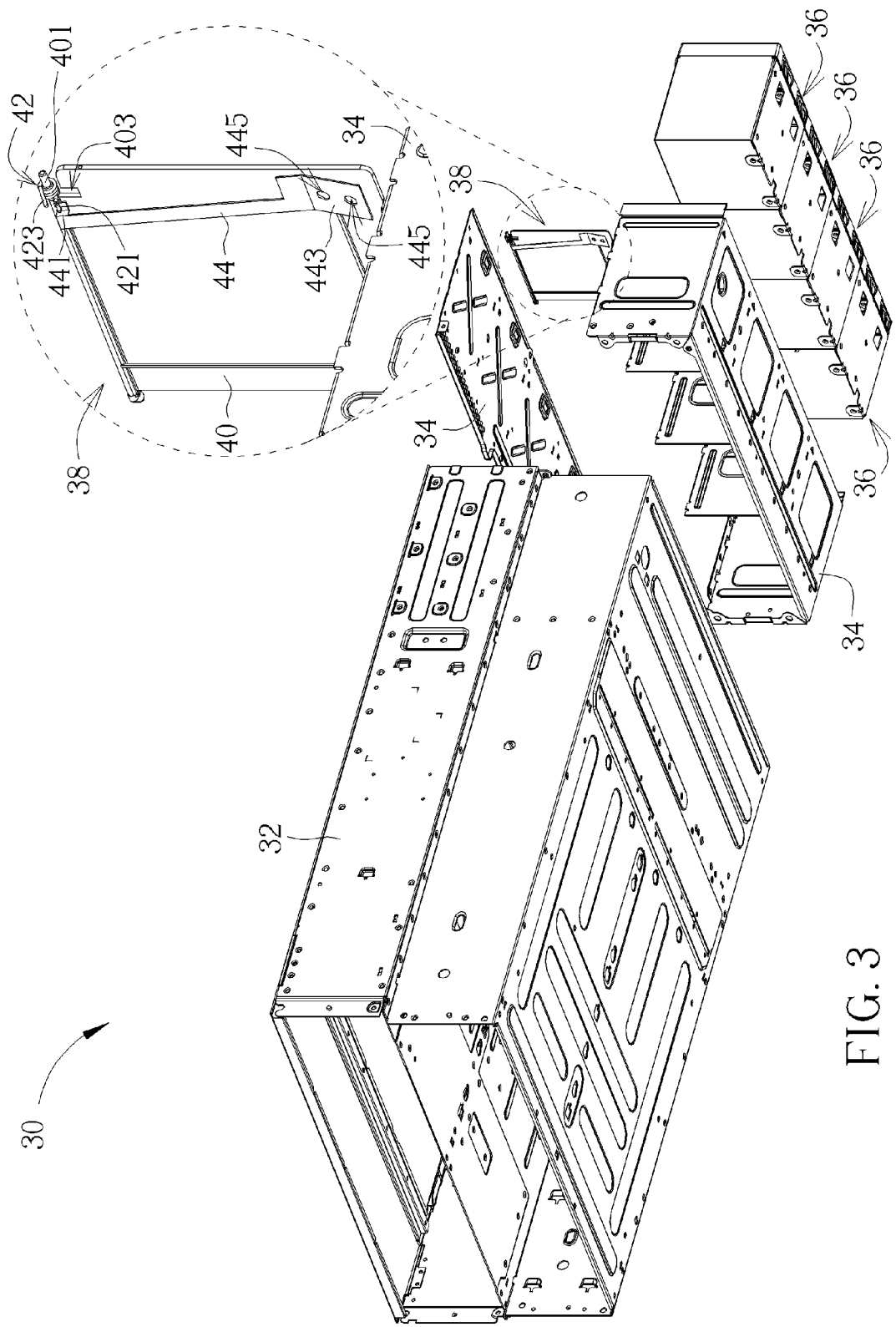
FIG. 3 is an exploded diagram of the electronic device in another view according to the first embodiment of the present invention.

Please refer to FIG. 1 to FIG. 3. FIG. 3 is an exploded diagram of the electronic device 30 in another view according to the first embodiment of the present invention. As shown in FIG. 1 to FIG. 3, the electronic device 30 further includes a plurality of flap door mechanisms 38, and a plurality of installing openings 341 are formed on the casing 34. The plurality of thermal fans 36 are installed inside the casing 34 via the plurality of installing openings 341, and the plurality of flap door mechanisms 38 are installed on the casing 34 and located in positions corresponding to the plurality of installing openings 341. When one of the plurality of thermal fans 36 is detached from the casing 34 for replacement, the flap door mechanism 38 is used for covering the installing opening 341 which is used for installing the thermal fan 36. In other words, the flap door mechanism 38 is used for preventing a flow from being drawn into the casing 34 via the installing opening 341, so as to prevent a reflow. Accordingly, the heat dissipating flows generated by the thermal fans 36 will not be disturbed by the reflow, so as to keep heat dissipating efficiency of the thermal fans 36.

It should be noticed that amounts of the thermal fan 36, the installing opening 341 and the flap door mechanism 38 correspond to one another. In this embodiment, the amounts of the thermal fan 36, the installing opening 341 and the flap door mechanism 38 are respectively four. The amounts of the thermal fan 36, the installing opening 341 and the flap door mechanism 38 are not limited to those illustrated in figures in this embodiment, and it depends on practical demands. Furthermore, the electronic device 30 is a server computer, but implementations of the electronic device 30 are not limited thereto. For example, the electronic device 30 can be a desktop computer as well. As for which one of the above-mentioned designs is adopted, it depends on practical demands.

Figure 4:
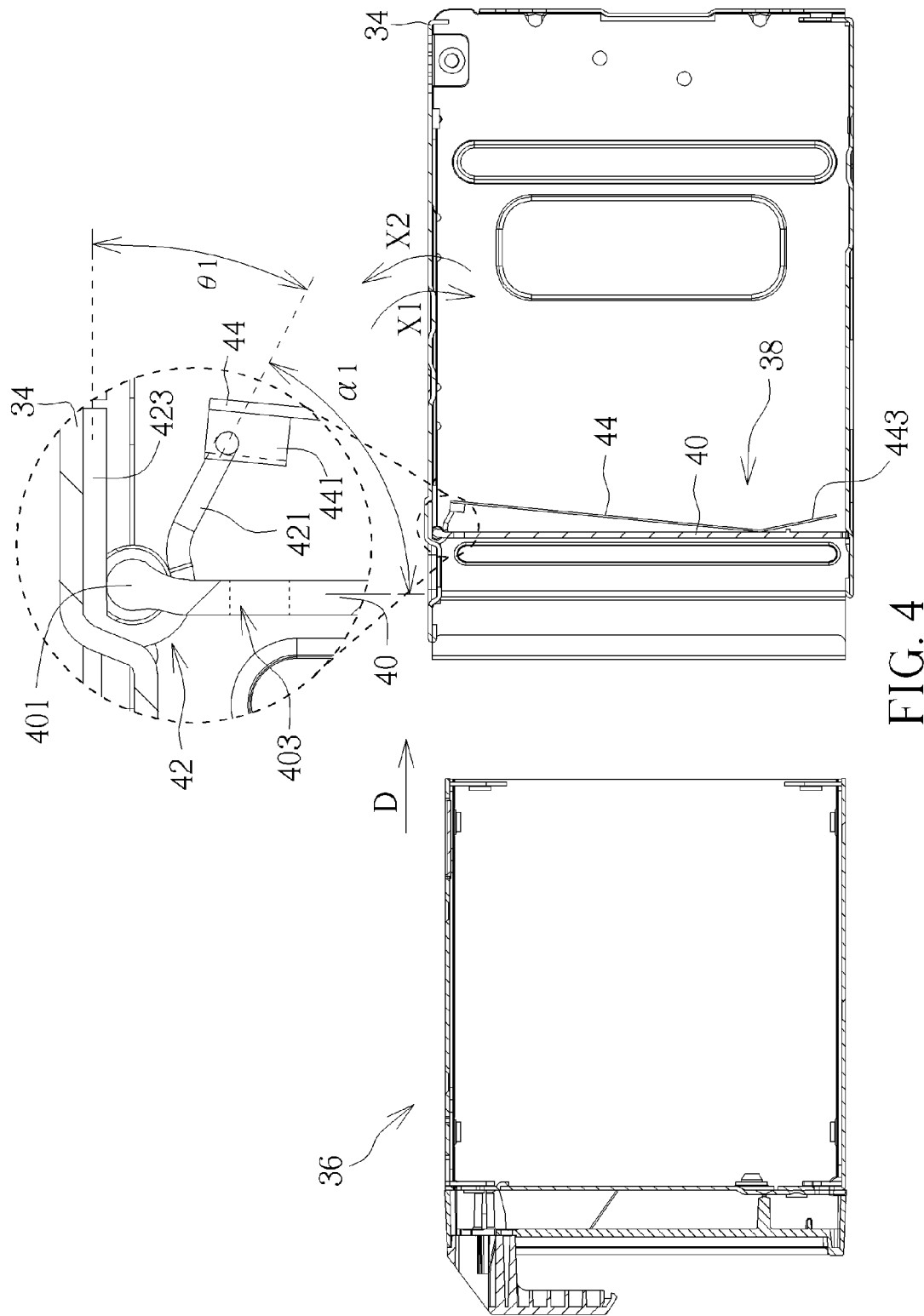
FIG. 4 to FIG. 6 are diagrams of a flap door mechanism in different statuses according to the first embodiment of the present invention.
Figure 5:
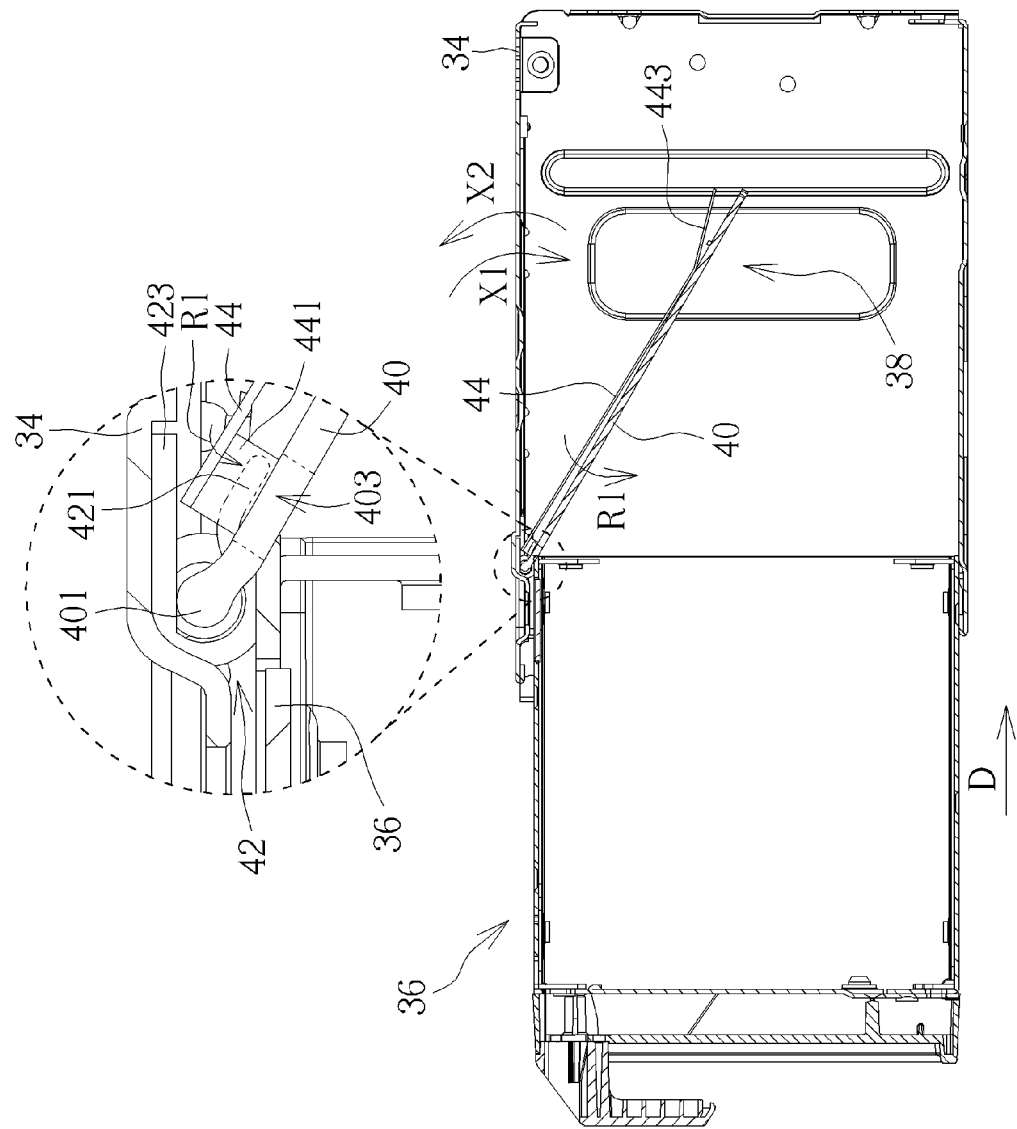
Figure 6:
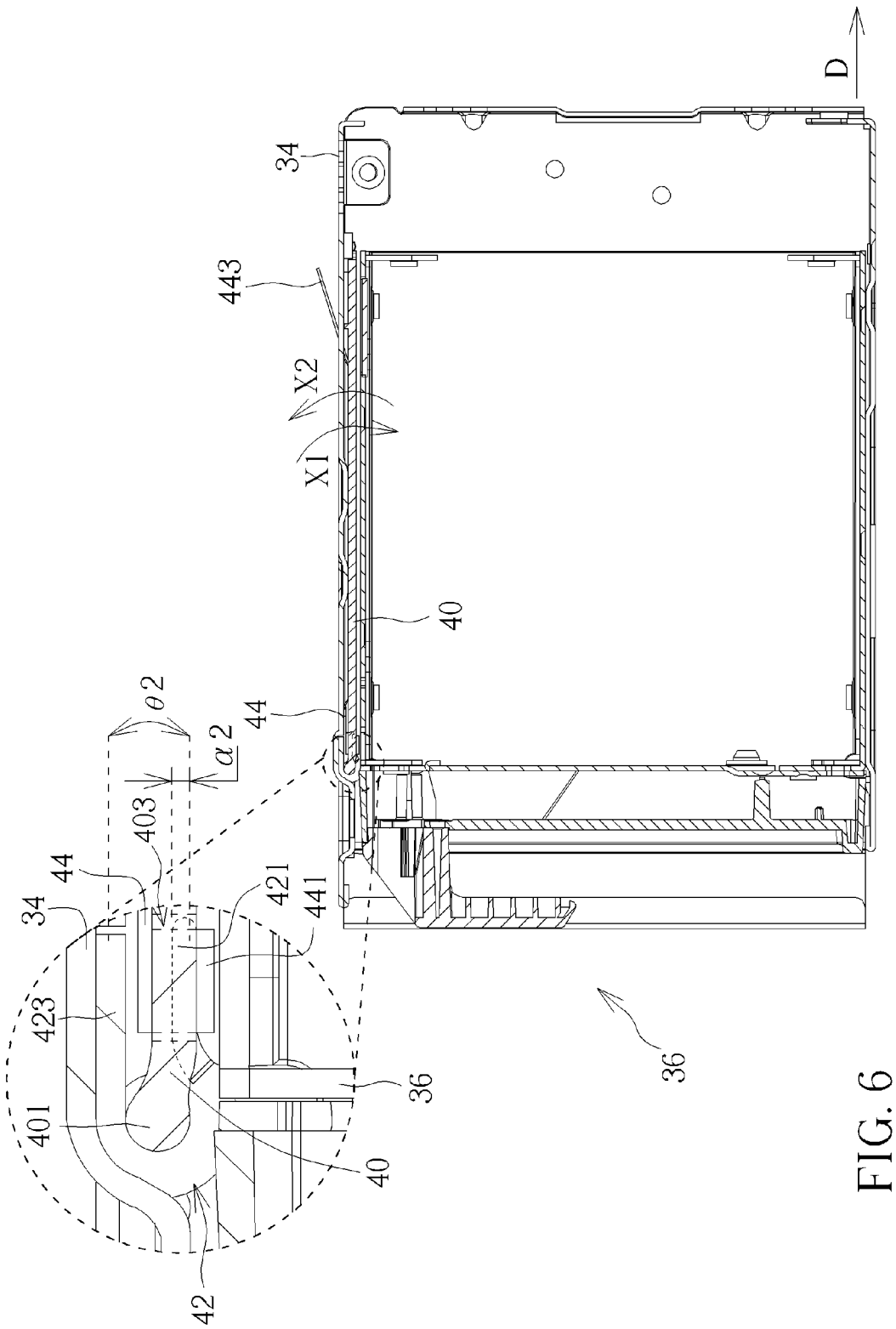

The housing 32 is omitted hereinafter for clearly illustrating structures and principles of the flap door mechanism and keep conciseness of the figures. Please refer to FIG. 1 to FIG. 6. FIG. 4 to FIG. 6 are diagrams of the flap door mechanism 38 in different statuses according to the first embodiment of the present invention. As shown in FIG. 1 to FIG. 6, the flap door mechanism 38 includes a door member 40 and a resilient member 42. The door member 40 is pivoted to the casing 34, the resilient member 42 is installed on the door member 40, and the resilient member 42 is used for driving the door member 40 to rotate in a first direction X1. When the thermal fan 36 is detached from the casing 34 for replacement, the resilient member 42 drives the door member 40 of the flap door mechanism 38 to rotate in the first direction X1, such that the door member 40 is activated to be located in a closed position shown in FIG. 4, so as to covering the installing opening 341. In such a manner, the door member 40 of the flap door mechanism 38 can prevent the flow from being drawn into the casing 34 via the installing opening 341, and thus it prevents the reflow and keeps heat dissipating efficiency of the thermal fan 36.

Furthermore, the flap door mechanism 38 further includes a spring arm member 44. In this embodiment, the spring arm member 44 is connected to the door member 40. The resilient member 42 includes a first end 421 and a second end 423, and the spring arm member 44 includes an abutting end 441. The abutting end 441 is used for abutting against the first end 421 of the resilient member 42, and the second end 423 of the resilient member 42 abuts against the casing 34. In this embodiment, the resilient member 42 is a torsion spring sheathing on a pivotal shaft 401 of the door member 40, the first end 421 of the resilient member 42 is a free end of the torsion spring, and the second end 423 of the resilient member 42 is a fixing end of the torsion spring. In addition, when the door member 40 is located in the closed position, a first torsion angle $\theta 1$ is included between the first end 421 and the second end 423 of the resilient member 42 (i.e. the torsion spring), as shown in FIG. 4. Practically, the first torsion angle $\theta 1$ is smaller than an angle between the first end 421 and the second end 423 as the resilient member 42 (i.e. the torsion spring) is unloaded. In other words, when the first end 421 and the second end 423 include the first torsion angle $\theta 1$ therebetween, the resilient member 42 (i.e. the torsion spring) is in a deformed status, so as to provide a torque to the door member 40 to be located in the closed position.

In perspective of designing the resilient member 42 (i.e. the torsion spring), the torque generated by the resilient member 42 (i.e. the torsion spring) due to deformation is required to resist the reflow from pushing the door member 40 when the door member 40 is located in the closed position, i.e. the first end 421 and the second end 423 include the first torsion angle $\theta 1$ therebetween. In such a manner, the door member 40 is capable of preventing the flow from being drawn into the casing 34 via the installing opening 341. In other words, the resilient member 42 (i.e. the torsion spring) is required to possess a stiffness to allow the door member 40 to be capable of preventing the reflow. Practically, increase of wire diameter of the torsion spring and/or reduce of routing number of the torsion spring is adapted to increase the stiffness of the torsion spring.

In addition, the spring arm member 44 further includes a fixing end 443 opposite to the abutting end 441. The fixing end 443 is used for being fixed on the door member 40. In this embodiment, the spring arm member 44 is a metal sheet, and the fixing end 443 of the spring arm member 44 (i.e. the metal sheet) is fixed on the door member 40 in a hot melting manner. In other words, a plurality of through holes 445 are formed on the fixing end 443, as shown in FIG. 3. When a plurality of hot melting posts (not shown in figures) on the door member 40 pass through the through hole 445 on the fixing end 443, the hot melting posts can be heated and melted on the fixing end 443, so as to fix the fixing end 443 onto the door member 40. Structures of the fixing end 443 are not limited to those illustrated in figures in this embodiment. For example, the fixing end 443 can be a bending structure as well, and a breach is formed on the door member 40 correspondingly. During assembly, the bending structure (i.e. the fixing end 443) can engage with the breach on the door member 40. In other words, the fixing end 443 can be fixed on the door member 40 in an engaging manner as well. In addition, the spring arm member 44 and the door member 40 can be integrally formed as well, i.e. the spring arm member 44 can be a plastic spring arm and is integrally formed with the door member 40 in a molding manner. As for which one of the above-mentioned designs is adopted, it depends on practical demands.

As shown in FIG. 3 to FIG. 6, the door member 40 further includes a through portion 403. When the thermal fan 36 is desired to be installed into the casing 34, the thermal fan 36 is pushed into the casing 34 along an assembly direction D, shown in FIG. 4. In the process that the thermal fan 36 is pushed into the casing 34 from the position shown in FIG. 4 along the assembly direction D, the thermal fan 36 pushes the door member 40 to rotate in a second direction X2 opposite to the first direction X1. Furthermore, when the door member 40 is rotated in the second direction X2, the spring arm member 44 is rotated with the door member 40 to drive the first end 421 of resilient member 42 to approach the second end 423, i.e. the deformation of the resilient member 42 is increased with rotation of the door member 40 along the second direction X2. When the thermal fan 36 moves from the position shown in FIG. 4 to a position shown in FIG. 5 along the assembly direction D, the door member 40 is rotated to the position shown in FIG. 5 in the second direction X2. Meanwhile, resiliently recovering force generated by the resilient member 42 due to deformation will be greater than recovering force due to stiffness of the spring arm member 44. In such a manner, the resilient member 42 can drive the first end 421 to push the abutting end 441 of the spring arm member 44 for bending the spring arm member 44 in a direction R1 farther away from the second end 423 of the resilient member 42, as shown in FIG. 5. Furthermore, when the thermal fan 36 is completely installed into the casing 34 along the assembly direction D, the thermal fan 36 pushes the door member 40 to rotate to an opened position shown in FIG. 6 along the second direction X2.

In the aforesaid process that the first end 421 of the resilient member 42 drives the spring arm member 44 to bend continuously, the first end 421 and the abutting end 441 can pass through the door member 40 via the through portion 403 in the direction R1. In such a manner, when the thermal fan 36 drives the door member 40 to rotate in the second direction X2, the first end 421 of the resilient member 42 and the abutting end 441 of the spring arm member 44 can pass through the door member 40 from a side of the door member 40, shown in FIG. 4, to another side of the door member 40, shown in FIG. 6. When the door member 40 is rotated to the opened position shown in FIG. 6, a second torsion angle θ2 is included between the first end 421 and the second end 423 of the resilient member 42. In this embodiment, the through portion 403 is a breach, as shown in FIG. 3, but structures of the through portion 403 are not limited thereto. For example, the through portion 403 can be an opening as well. As for which one of the above-mentioned designs is adopted, it depends on practical demands.

As mentioned above, bend of the spring arm member 44 resulting from the process that the door member 40 is rotated in the second direction X2 can reduce deformation between the first end 421 and the second end 423 of the resilient member 42, i.e. the bend of the spring arm member 44 resulting from the process that the door member 40 is rotated in the second direction X2 can increase the second torsion angle θ2 between the first end 421 and the second end 423 of the resilient member 42. In other words, when the door member 40 is located in the opened position shown in FIG. 6, the second torsion angle θ2 is greater than limit angle between the first end 421 and the second end 423 of the resilient member 42. That is, when the first end 421 and the second end 423 of the resilient member 42 include the second torsion angle θ2 therebetween, the resilient member 42 does not deform permanently. In summary, the bend of the spring arm member 44 can prevent the first end 421 and the second end 423 from permanently deforming due to over deformation. In other words, the flap door mechanism 38 of the present invention not only enables the resilient member 42 to keep the stiffness for preventing the reflow, but also utilizes the bend of the spring arm member 44 resulting from the process that the door member 40 is rotated in the second direction X2 for avoiding the first end 421 and the second end 423 of the resilient member 42 from permanently deforming due to over deformation when the door member 40 is located in the opened position, so as to confirm movement of the resilient member 42 and elongate the life of the resilient member 42.

When the door member 40 is located in the closed position shown in FIG. 4, a first assembly angle α1 is included between the first end 421 of the resilient member 42 and the door member 40. When the door member 40 is located in the opened position shown in FIG. 6, a second assembly angle α2 is included between the first end 421 of the resilient member 42 and the door member 40. Geometrically, in the process that the door member 40 is rotated from the closed position to the opened position, an angle of the bend of the spring arm member 44 is equal to an angle subtracting the second assembly angle α2 from the first assembly angle α1. In other words, in the process that the door member 40 is rotated from the closed position to the opened position, an angle that the angle of the bend of the spring arm member 44 adds to the second torsion angle θ2 is equal to an angle that the door member 40 is rotated (i.e. 90 degrees).

Figure 7:
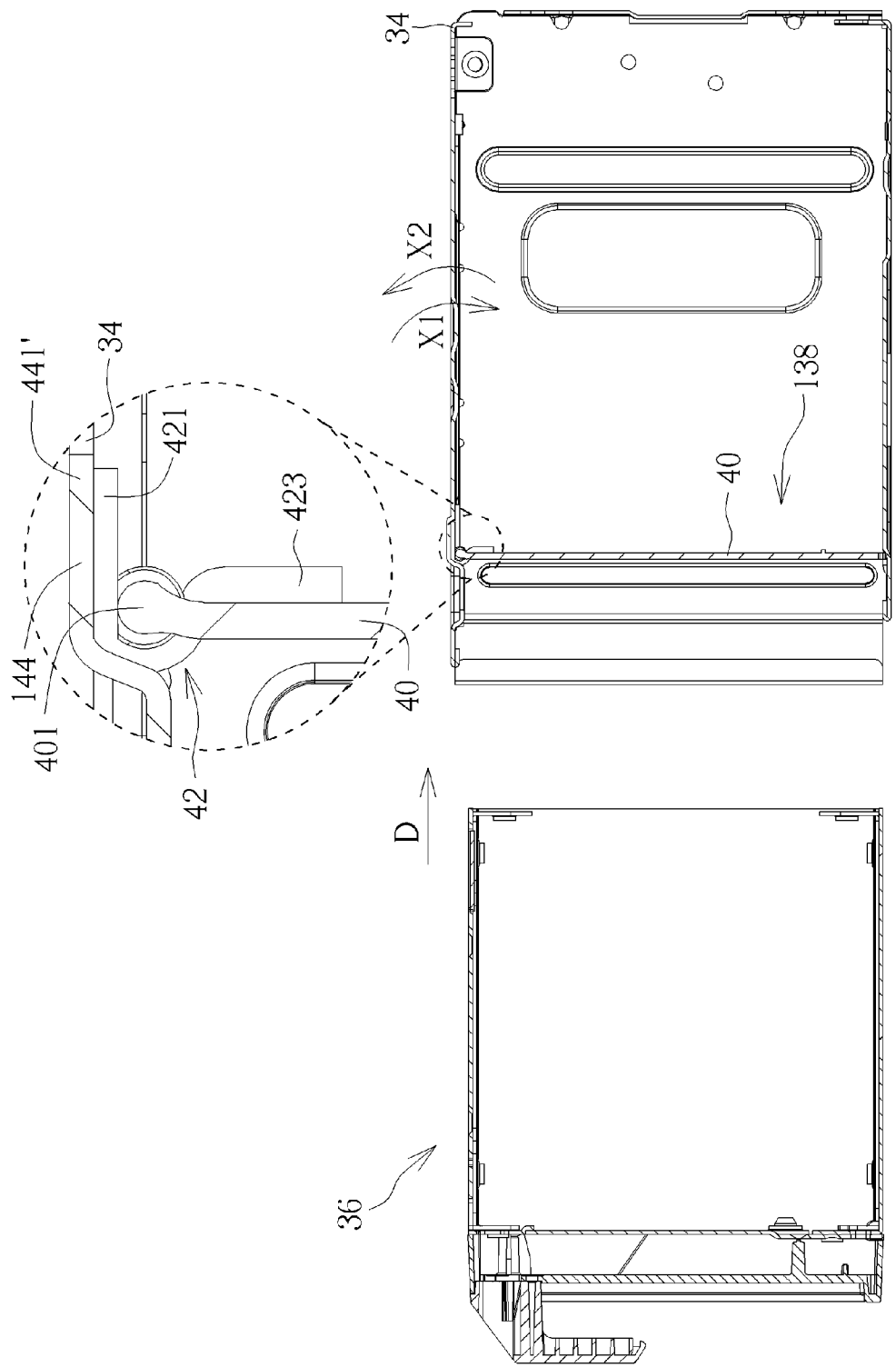
FIG. 7 to FIG. 9 are diagrams of a flap door mechanism in different statuses according to a second embodiment of the present invention.
Figure 8:
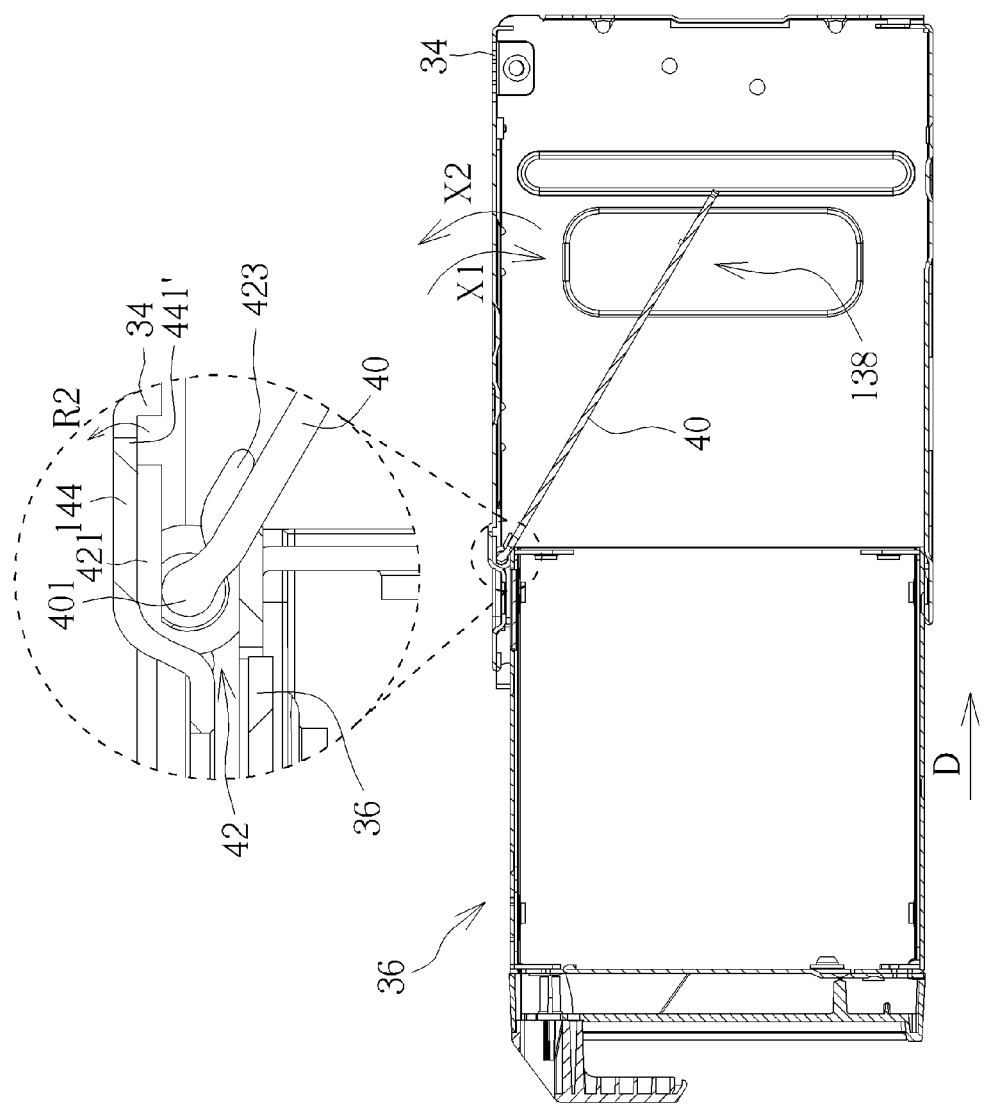
Figure 9:
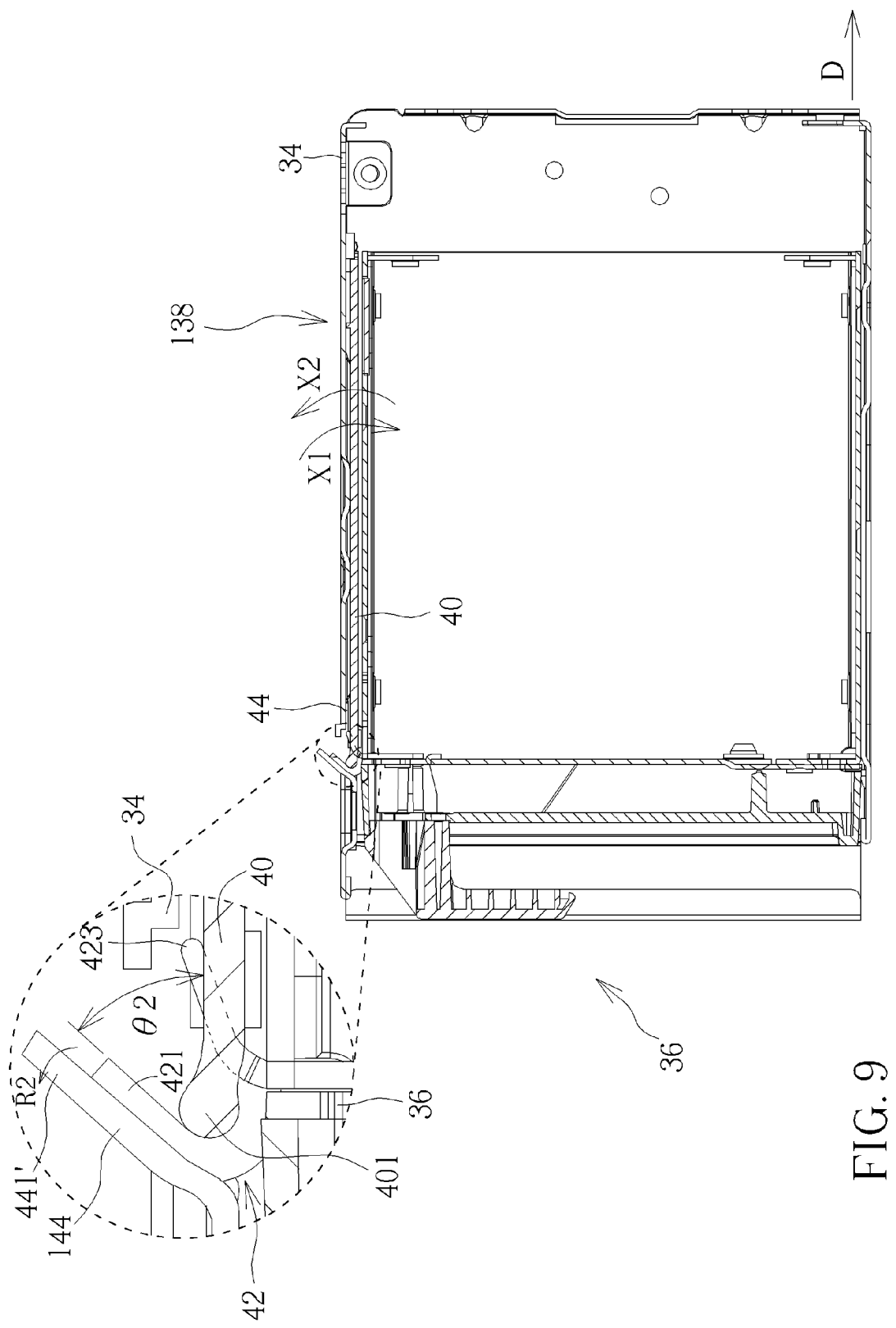

Please refer to FIG. 7 to FIG. 9. FIG. 7 to FIG. 9 are diagrams of a flap door mechanism 138 in different statuses according to a second embodiment of the present invention. As shown in FIG. 7 to FIG. 9, the main difference between the flap door mechanism 138 and the aforesaid flap door mechanism 38 is that a spring arm member 144 of the flap door mechanism 138 is connected to the casing 34 and the second end 423 of the resilient member 42 of the flap door mechanism 138 abuts against the door member 40. In this embodiment, the first end 421 of the resilient member 42 is a fixing end of the torsion spring, and the second end 423 of the resilient member 42 is a free end of the torsion spring. Furthermore, the spring arm member 144 and the casing 34 are integrally formed, but the present invention is not limited thereto. For example, the spring arm member 144 can be a separate part which is selectively fixed on the casing 34 in an engaging or in a hot melting manner. As for which one of the above-mentioned designs is adopted, it depends on practical demands.

As mentioned above, when the thermal fan 36 is desired to be installed in the casing 34, the thermal fan 36 is pushed into the casing 34 along the assembly direction D, shown in FIG. 7. Meanwhile, the thermal fan 36 pushes the door member 40 to rotate in the second direction X2. When the door member 40 is rotated in the second direction X2, the second end 423 of the resilient member 42 is rotated with the door member 40 to approach the first end 421, i.e. the deformation of the resilient member 42 is increased with rotation of the door member 40 in the second direction X2. When the thermal fan 36 moves from the position shown in FIG. 7 to a position shown in FIG. 8 along the assembly direction D, the door member 40 is rotated to the position shown in FIG. 5 in the second direction X2. Meanwhile, resiliently recovering force generated by the resilient member 42 due to deformation will be greater than recovering force due to stiffness of the spring arm member 144. In such a manner, the resilient member 42 can drive the first end 421 to push an abutting end 441' of the spring arm member 144 for bending the spring arm member 144 in a direction R2 farther away from the second end 423 of the resilient member 42. Furthermore, when the thermal fan 36 is completely installed into the casing 34 along the assembly direction D, the first end 421 of the resilient member 42 can bend the spring arm member 144 to be expanded out of the casing 34, as shown in FIG. 9.

In such a manner, bend of the spring arm member 144 resulting from the process that the door member 40 is rotated in the second direction X2 can reduce deformation between the first end 421 and the second end 423 of the resilient member 42, i.e. the bend of the spring arm member 144 resulting from the process that the door member 40 is rotated in the second direction X2 can increase the second torsion angle θ2 between the first end 421 and the second end 423 of the resilient member 42. In other words, when the door member 40 is located in the opened position, the bend of the spring arm member 144 can prevent the first end 421 and the second end 423 from deforming permanently. Components with denoted in this embodiment identical to those in the aforesaid embodiment have identical structures and functions, and further description is omitted herein for simplicity.

Figure 10:
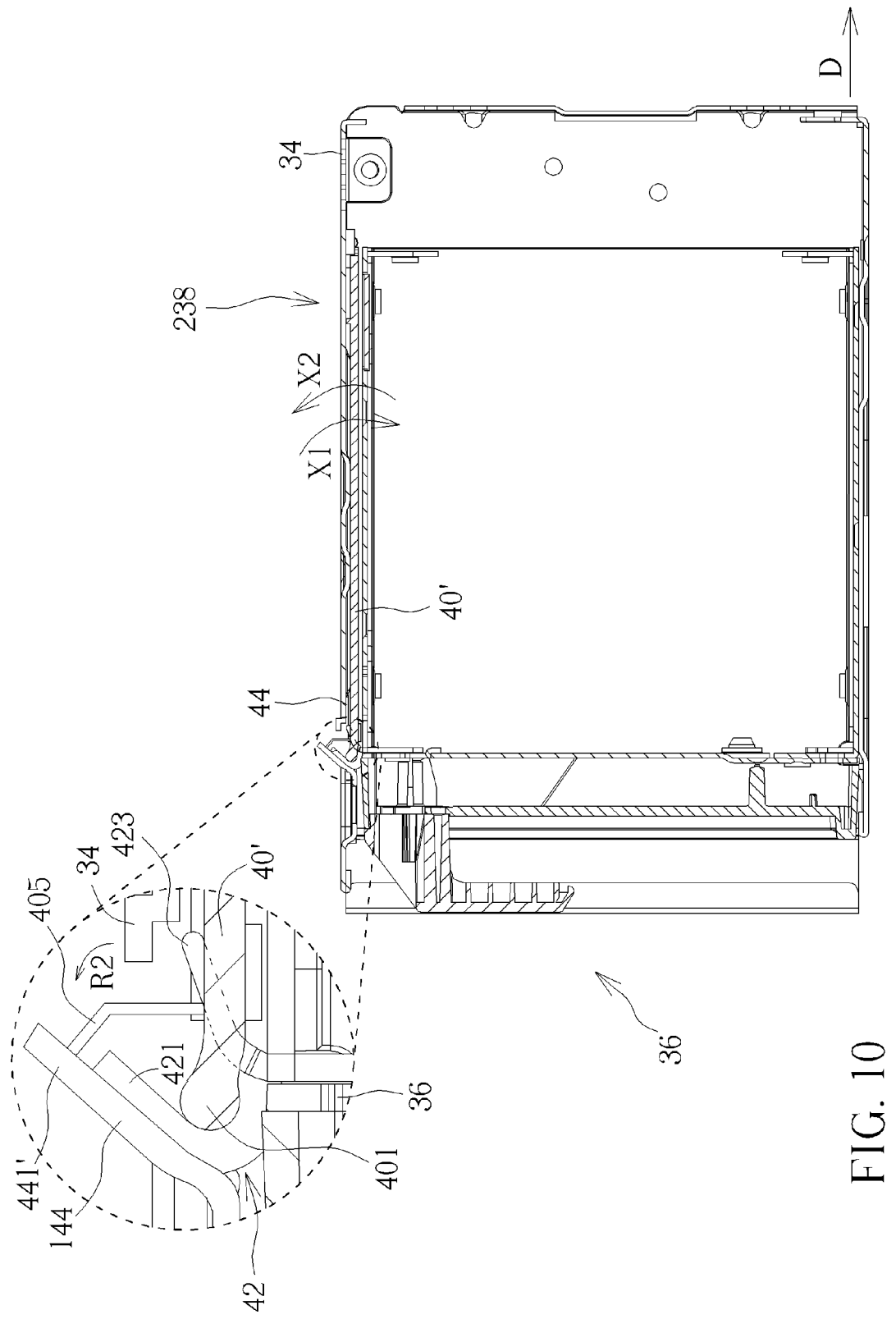
FIG. 10 is a diagram of a flap door mechanism in an opened status according to a third embodiment of the present invention.

Please refer to FIG. 10. FIG. 10 is a diagram of a flap door mechanism 238 in an opened status according to a third embodiment of the present invention. As shown in FIG. 10, the main difference between the flap door mechanism 238 and the aforesaid flap door mechanism 138 is that a door member 40' of the flap door mechanism 238 includes a pushing structure 405. When the door member 40' is pushed to rotate in the second direction X2 by the thermal fan 36, the pushing structure 405 is used for pushing the spring arm member 144 to bend in the direction R2 farther away from the second end 423 of the resilient member 42. Similarly, when the thermal fan 36 is completely installed in the casing 34, the spring arm member 144 is capable of bending to be expanded out of the casing 34, as shown in FIG. 10. Components with denoted in this embodiment identical to those in the aforesaid embodiment have identical structures and functions, and further description is omitted herein for simplicity.

Figure 11:
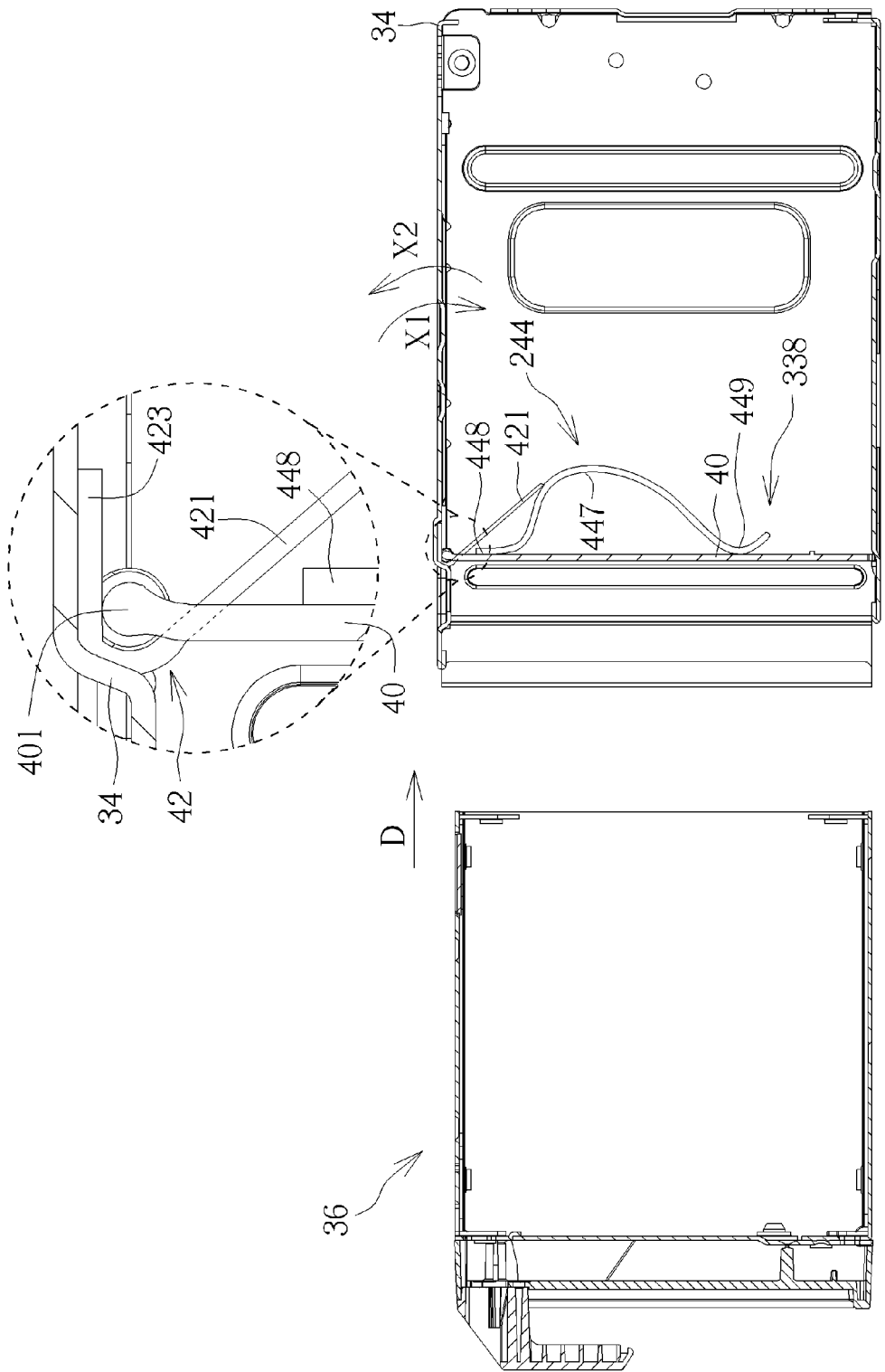
FIG. 11 to FIG. 13 are diagrams of a flap door mechanism in different statuses according to a fourth embodiment of the present invention.
Figure 12:
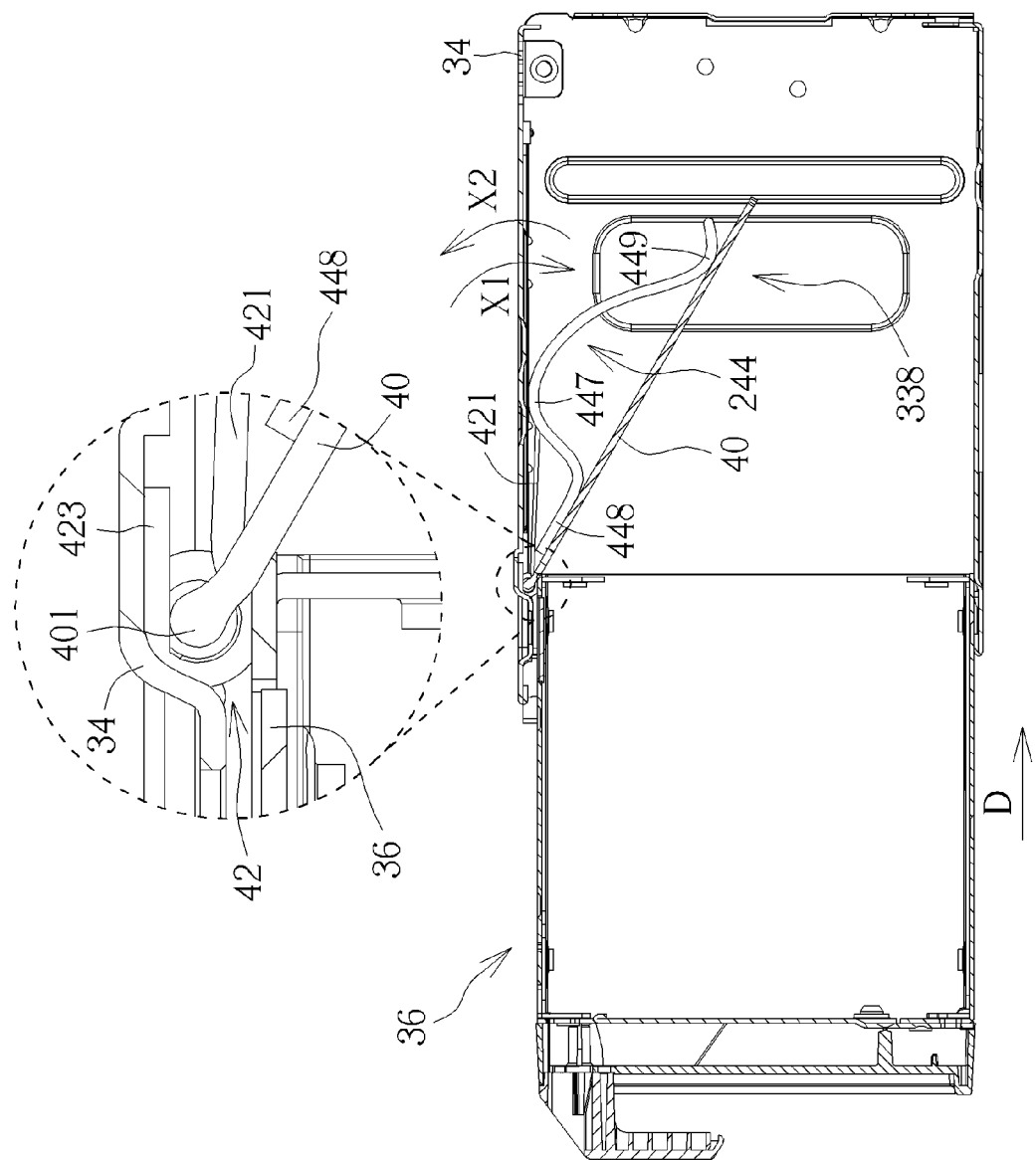
Figure 13:
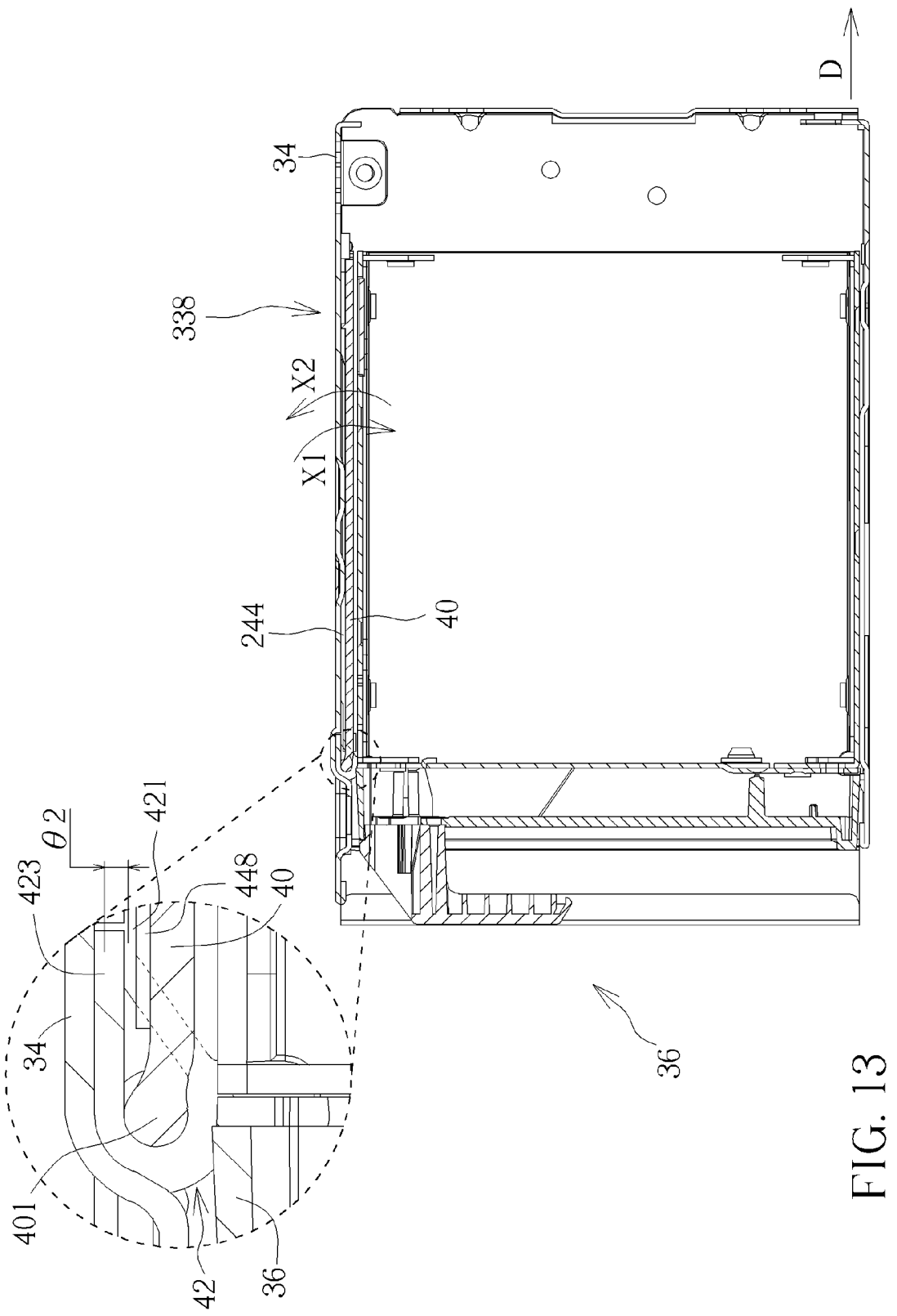

Please refer to FIG. 11 to FIG. 13. FIG. 11 to FIG. 13 are diagrams of a flap door mechanism 338 indifferent statuses according to a fourth embodiment of the present invention. As shown in FIG. 11 to FIG. 13, the main difference between the flap door mechanism 338 and the aforesaid flap door mechanism 38 is that the second end 423 of the resilient member 42 of the flap door mechanism 338 abuts against the casing 34 and a spring arm member 244 of the flap door mechanism 338 includes a bending portion 447. The bending portion 447 is used for abutting against the first end 421 of the resilient member 42. Furthermore, the spring arm member 244 further includes a fixing portion 448 and a sliding portion 449. The fixing portion 448 is connected to an end of the bending portion 447, and the sliding portion 449 is connected to another end of the bending portion 447. The fixing portion 448 is used for being fixed on the door member 40, and the sliding portion 449 is used for slidably abutting against the door member 40.

As mentioned above, when the thermal fan 36 is desired to be installed in the casing 34, the thermal fan 36 is pushed into the casing 34 along the assembly direction D, shown in FIG. 11. Meanwhile, the thermal fan 36 pushes the door member 40 to rotate in the second direction X2. When the door member 40 is rotated in the second direction X2, the door member 40 activates the spring arm member 244 to rotate in the second direction X2. Meanwhile, the bending portion 447 of the spring arm member 244 activates the first end 421 of the resilient member 42 to approach the second end 423. When the thermal fan 36 moves to a position shown in FIG. 12 along the assembly direction D, the casing 34 abuts against the bending portion 447 of the spring arm member 244. Furthermore, when the thermal fan 36 continues to move from the position shown in FIG. 12 along the assembly direction D, the door member 40 continues to rotate from the position shown in FIG. 12 along the second direction X2. Meanwhile, the casing 34 presses the bending portion 447. In the process that the casing 34 presses the bending portion 447, the sliding portion 449 of the spring arm member 244 slides along the door member 40 and in a direction farther away from the fixing portion 448. In such a manner, the bending portion 447 of the spring arm member 244 is pressed to be flattened on the door member 40 by the casing 34.

When the casing 34 presses the bending portion 447 of the spring arm member 244 to be flattened on the door member 40, the spring arm member 244 is pressed by the casing 34 and no longer rotates with the door member 40 along the second direction X2. Since the bending portion 447 of the spring arm member 244 abuts against the first end 421 of the resilient member 42, the bending portion 447 of the spring arm member 244 no longer activates the first end 421 of the resilient member 42 to approach the second end 423. In other words, in the process that the casing 34 presses the bending portion 447, the first end 421 of the resilient member 42 no longer deforms relative to the second end 423. In such a manner, deformation of the spring arm member 244 resulting from being pressed when the door member 40 is rotated in the second direction X2 can reduce deformation between the first end 421 and the second end 423 of the resilient member 42, i.e. the deformation of the spring arm member 244 resulting from being pressed in the process that the door member 40 is rotated in the second direction X2 can increase the second torsion angle θ2 between the first end 421 and the second end 423 of the resilient member 42. In other words, when the door member 40 is located in the opened position, the deformation of the spring arm member 244 can prevent the first end 421 and the second end 423 from deforming permanently due to over deformation. Components with denoted in this embodiment identical to those in the aforesaid embodiment have identical structures and functions, and further description is omitted herein for simplicity.

Compared to the prior art, when the door member rotates to be closed on the casing in the first direction, the resilient member of the flap mechanism of the present invention is utilized for generating the torque resulting from deformation, so as to resist the flow from pushing the door member and prevent the flow from being drawn into the casing via the door member. In such a manner, the flap door mechanism prevents the reflow resulting from the flow from being drawn into the casing, so as to prevent the reflow from disturbing the heat dissipating flow inside the casing and thus to enhance the heat dissipating efficiency of the electronic device.

In addition, when the door member rotates to be opened relative the casing in the second direction, either the bend of the spring arm member resulting from being activated by the end of the resilient member or deformation of the spring arm member resulting from being pressed by the casing is utilized for reducing the deformation between the two ends of the resilient member, so as to prevent the two ends of the resilient member from deforming permanently due to over deformation. In other words, the flap door mechanism of the present invention utilizes the spring arm member for avoiding the resilient member from being deformed permanently, so as to confirm the movement of the flap door mechanism and elongate the life of the flap door mechanism.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A flap door mechanism, comprising:
   a door member pivoted to a casing and comprising a pushing structure;
   a resilient member installed on the door member and for driving the door member to rotate in a first direction, the resilient member comprising a first end and a second end; and
   a spring arm member connected to the casing, the spring arm member comprising an abutting end for abutting against the first end, the second end of the resilient member abutting against the door member, the resilient member driving the first end to push the abutting end and the pushing structure pushing the spring arm member for bending the spring arm member to make the abutting end expand out of the casing when the door member rotates in a second direction opposite to the first direction, so as to reduce deformation between the first end and the second end of the resilient member.

2. The flap door mechanism of claim 1, wherein the spring arm member and the casing are integrally formed.

3. An electronic device, comprising:
   a casing; and
   a flap door mechanism installed on the casing, comprising:
      a door member pivoted to the casing and comprising structure;
      a resilient member installed on the door member and for driving the door member to rotate in a first direction, the resilient member comprising a first end and a second end; and
      a spring arm member connected to the casing, the spring arm member comprising an abutting end for abutting against the first end, the second end of the resilient member abutting against the door member, the resilient member driving the first end to push the abutting end and the pushing structure pushing the spring arm member for bending the spring arm member to make the abutting end expand out of the casing when the door member rotates in a second direction opposite to the first direction, so as to reduce deformation between the first end and the second end of the resilient member.

4. A flap door mechanism, comprising:
a door member pivoted to a casing and comprising a through portion;
a resilient member installed on the door member and for driving the door member to rotate in a first direction, the resilient member comprising a first end and a second end; and
a spring arm member connected to the door member, the spring arm member comprising an abutting end, the abutting end being a bending arm formed toward the through portion for abutting against the first end, the second end of the resilient member abutting against the casing, the resilient member driving the first end to push the abutting end when the door member rotates in a second direction opposite to the first direction, such that the spring arm member is bent in a direction away from the second end and the first end and the bending arm pass through the through portion of the door member without being contained in the through portion and protrude from the door member.

5. The flap door mechanism of claim 4, wherein the spring arm member further comprises a fixing end opposite to the abutting end, the fixing end is for being fixed on the door member.

6. The flap door mechanism of claim 5, wherein the fixing end is fixed on the door member in a hot melting manner.

7. The flap door mechanism of claim 4, wherein the spring arm member and the door member are integrally formed.

8. The flap door mechanism of claim 4, wherein a first assembly angle is included between the first end of the resilient member and the door member when the door member rotates to a closed position in the first direction, and a second assembly angle is included between the first end of the resilient member and the door member when the door member rotates to an opened position in the second direction.

9. The flap door mechanism of claim 4, wherein a first torsion angle is included between the first end and the second end of the resilient member when the door member is located in a closed position, and a second torsion angle is included between the first end and the second end of the resilient member when the door member is located in an opened position.

10. The flap door mechanism of claim 4, wherein the through portion is a breach.

11. An electronic device, comprising:
a casing; and
a flap door mechanism installed on the casing, comprising:
    a door member pivoted to the casing and comprising a through portion;
    a resilient member installed on the door member and for driving the door member to rotate in a first direction, the resilient member comprising a first end and a second end; and
    a spring arm member connected to the door member, the spring arm member comprising an abutting end, the abutting end being a bending arm formed toward the through portion for abutting against the first end, the second end of the resilient member abutting against the casing, the resilient member driving the first end to push the abutting end when the door member rotates in a second direction opposite to the first direction, such that the spring arm member is bent in a direction away from the second end and the first end and the bending arm pass through the through portion of the door member without being contained in the through portion and protrude from the door member.

12. The electronic device of claim 11, wherein the spring arm member further comprises a fixing end opposite to the abutting end, and the fixing end is for being fixed on the door member.

* * * * *